United States Patent [19]

Sato et al.

[11] Patent Number: 5,692,025
[45] Date of Patent: *Nov. 25, 1997

[54] IMAGE-SENSING-SYSTEM BOOSTER CIRCUIT FOR DRIVING IMAGE SENSOR

[75] Inventors: Yasushi Sato; Nobuhiko Ohsawa, both of Kanagawa, Japan

[73] Assignee: Sony Corporation, Tokyo, Japan

[*] Notice: The term of this patent shall not extend beyond the expiration date of Pat. No. 5,469,484.

[21] Appl. No.: 442,684

[22] Filed: May 17, 1995

Related U.S. Application Data

[63] Continuation of Ser. No. 242,864, May 16, 1994, Pat. No. 5,469,484, which is a continuation of Ser. No. 127,508, Sep. 28, 1993, abandoned.

[30] Foreign Application Priority Data

Sep. 29, 1992 [JP] Japan ................... 4-285224

[51] Int. Cl.$^6$ ............... G11C 19/28; H01L 27/14; H03K 3/01; H03K 3/42
[52] U.S. Cl. ............... 377/58; 257/223; 257/299; 257/233; 327/536; 327/537
[58] Field of Search ............... 257/222, 223, 257/229–234, 299; 377/58, 61; 327/534, 536, 537

[56] References Cited

U.S. PATENT DOCUMENTS

| | | | |
|---|---|---|---|
| 3,942,047 | 3/1976 | Buchanan | 307/296.1 |
| 4,717,945 | 1/1988 | Yusa et al. | 257/229 |
| 4,977,584 | 12/1990 | Kohno et al. | 257/233 |
| 4,984,256 | 1/1991 | Imai | 377/58 |
| 5,132,759 | 7/1992 | Honjoh et al. | 377/61 |
| 5,262,661 | 11/1993 | Kuroda et al. | 257/233 |
| 5,469,484 | 11/1995 | Sato et al. | 377/58 |
| 5,471,246 | 11/1995 | Nishima et al. | 327/534 |

*Primary Examiner*—Gene M. Munson
*Attorney, Agent, or Firm*—Hill, Steadman & Simpson

[57] ABSTRACT

In a drive circuit of a solid-state imaging device, no specific voltage source exclusively used to set a substrate voltage is required. An external circuit required when the entire drive circuit is fabricated as an integrated circuit, can be eliminated. An image sensing system comprises: a solid-state imaging device formed on a semiconductor body, said solid-state imaging device including a plurality of photo sensors formed in a major surface of said semiconductor body, said photo sensors receiving light incident thereon and generating charges corresponding to said incident light and accumulating said charges therein, a video signal output means for outputting a video signal corresponding to said accumulated charges, and a charge drain discharging said charges from said photo sensors; a timing generator for generating a timing signal; a first power supply source providing a first voltage to said solid-state imaging device; a second power supply source providing a second voltage to said solid-state imaging device, said second voltage being higher than said first voltage; and a driver means for said solid-state imaging device, including a driving circuit for driving said video signal output means in response to said timing signal, a booster circuit for receiving said first and second voltages and for providing a third voltage higher than said second voltage, said booster circuit being driven in synchronism with said timing signal, and a voltage setting means for setting a drive voltage of said charge drain based on said third voltage.

9 Claims, 5 Drawing Sheets

(repetition period : 15.75KHz)

5,692,025

IMAGE-SENSING-SYSTEM BOOSTER CIRCUIT FOR DRIVING IMAGE SENSOR

This is a continuation of U.S. patent application Ser. No. 08/242,864 filed May 16, 1994, now issued as U.S. Pat. No. 5,469,484 which is a continuation of U.S. patent application Ser. No. 08/127,508, filed Sep. 28, 1993, now abandoned.

BACKGROUND OF THE INVENTION

1. Field of the Invention

The present invention generally relates to a drive circuit for a solid-state imaging device. More specifically, the present invention is directed to such an image sensor driving circuit suitable for driving a solid-state imaging element requiring a higher substrate voltage "Vsub" than a voltage of a power supply used for this solid-state imaging device.

2. Description of the Prior Art

In commercially available solid-state imaging elements, for instance, a CCD (charge-coupled device) image sensor, both a positive-polarity voltage "VH" having a value on the order of 15 V and a negative-polarity voltage "VL" having a value on the order of −8.5 V are utilized as a power source voltage.

In addition to this power source voltage, a proper substrate voltage "Vsub" must be set in such a CCD image sensor having such a structure that an n-type substrate is employed as an overflow drain. There are possibilities that this substrate voltage "Vsub" must be selected to be higher than the positive-polarity voltage "VH".

Accordingly, in the conventional CCD image sensor which requires the higher substrate voltage "Vsub" than the positive-polarity voltage "$V_H$", as shown in FIG. 1, the following substrate voltage setting arrangement is employed. That is, the Vsub power source 21 having the source voltage on the order of 20 V, is employed, and in the substrate voltage setting circuit 17' constructed of the operational amplifier 20 whose drive voltage is equal to the source voltage applied from the Vsub power source 21, the desirable substrate voltage "Vsub" is set based on the reference voltage "Vref" produced by controlling the variable resistor "VR".

As previously described, in the conventional CCD image sensor, the Vsub power source 21 exclusively used to set the substrate voltage Vsub higher than the positive-polarity voltage $V_H$ must be employed in the conventional CCD drive circuit. As a consequence, there is such a problem that when this CCD drive circuit would be formed as an integrated circuit (IC), a volume of the external circuit should be necessarily increased.

SUMMARY OF THE INVENTION

The present invention has been made in an attempt to eliminate such a substrate-voltage power source for properly setting a desirable substrate voltage from the conventional CCD image sensor drive circuit, and therefore, has an object to provide a drive circuit of a solid-state imaging element capable of eliminating an external circuit such as the conventional substrate-voltage power source when an overall drive circuit is manufactured as an integrated circuit.

To achieve the above-described object, an image sensing system, according to one aspect of the present invention, comprises:

a solid-state imaging device formed on a semiconductor body, the solid-state imaging device including a plurality of photo sensors formed in a major surface of the semiconductor body, the photo sensors receiving light incident thereon and generating charges corresponding to the incident light and accumulating the charges therein, a video signal output means for outputting a video signal corresponding to the accumulated charges, and a charge drain discharging the charges from said photo sensors;

a timing generator for generating a timing signal;

a first power supply source providing a first voltage to the solid-state imaging device;

a second power supply source providing a second voltage to the solid-state imaging device, said second voltage being higher than the first voltage; and a driver means for the solid-state imaging device, including a driving circuit for driving the video signal output means in response to the timing signal, a booster circuit for receiving the first and second voltages and for providing a third voltage higher than said second voltage, said booster circuit being driven in synchronism with the timing signal, and a voltage setting means for setting a drive voltage of the charge drain based on said third voltage.

Further, an image sensing system, according to another aspect of the present invention, comprises:

a solid-state imaging device formed on a semiconductor body, the solid-state imaging device including a plurality of photo sensors formed in a major surface of the semiconductor body, the photo sensors receiving light incident thereon and generating charges corresponding to the incident light and accumulating the charges therein, a video signal output means for outputting a video signal corresponding to the accumulated charges, and a charge drain discharging said charges from the photo sensors;

a timing generator for generating a timing signal;

a first power supply source from which a first voltage is provided as a first output;

a second power supply source from which a second voltage is provided as a second output, wherein the second voltage is higher than the first voltage; and a driver means for the solid-state imaging device, including a driving circuit for driving the video signal output means in response to the timing signal, a booster circuit for receiving the first and second voltages and for providing a third voltage higher than the second voltage as a third output, and a voltage setting means for setting a drive voltage of the charge drain based on said third voltage, wherein the driving circuit, said booster circuit, and the voltage setting means are formed on, or in the same semiconductor substrate.

Also, an image sensing system, according to another aspect of the present invention, comprises:

a solid-state imaging device formed on a semiconductor substrate of a first conductivity type, the solid-state imaging device including a well region of a second conductivity type formed on a major surface of the semiconductor body, a plurality of photo sensors of the first conductivity type formed on a surface of the well region, the photo sensors receiving light incident thereon and generating charges corresponding to the incident light and accumulating the charges therein, and a charge transferring means for transferring the charges to an output terminal;

a timing generating for generating a timing signal;

a first power supply source from which a first voltage is provided as a first output;

a second power supply source from which a second voltage is provided as a second output, wherein the second voltage is higher than the first voltage; and a driver means for the solid-state imaging device including a driving circuit for driving the charge transferring means in response to the timing signal, a booster circuit for receiving the first and second voltages and for providing a third voltage higher than the second voltage as a third output, the booster circuit being driven in synchronism with the timing signal, and a voltage setting mean for setting a drive voltage of the semiconductor substrate based on the third voltage, thereby to discharge said accumulated charges from the photo sensors.

In the image sensing system according to the present invention, the booster circuit is built which boosts the power supply voltage of the solid-state imaging device in synchronism with the timing signal used to drive the charge transfer register. In the substrate voltage setting circuit, since the substrate voltage of the solid-state imaging device is set by utilizing the boosted voltage derived from the booster circuit as the supply voltage of this solid-state imaging device, no longer the conventional power-source exclusively used to set the desirable substrate voltage is required.

Also, since the switching operation of the booster circuit is performed in synchronism with the timing signal for driving the charge transfer register of the solid-state imaging device, no beat phenomenon will occur between the output from the solid-state imaging device and the driving clock pulse, so that there is no deterioration in image quality caused by this beat phenomenon.

BRIEF DESCRIPTION OF DRAWINGS

The above-described object and other features of the present invention will be apparent from the following detailed descriptions in conjunction with the accompanying drawings, in which.

DETAILED DESCRIPTION OF THE PREFERRED EMBODIMENTS

Figure 1:
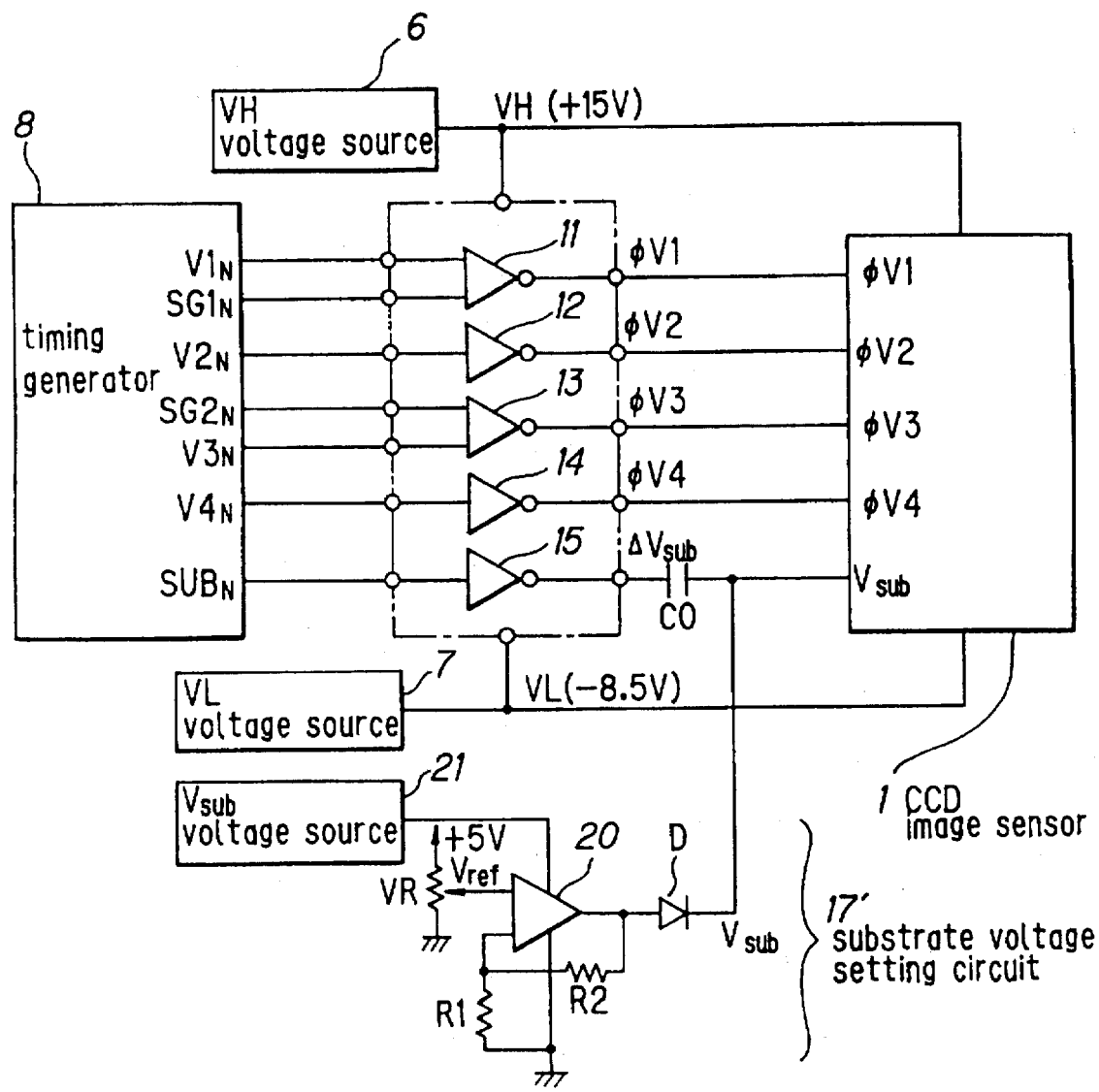
FIG. 1 is a schematic block diagram of the conventional CCD image sensor driving circuit.

Referring now to the drawings, an imaging system according to preferred embodiments of the present invention will be described.

Figure 2:
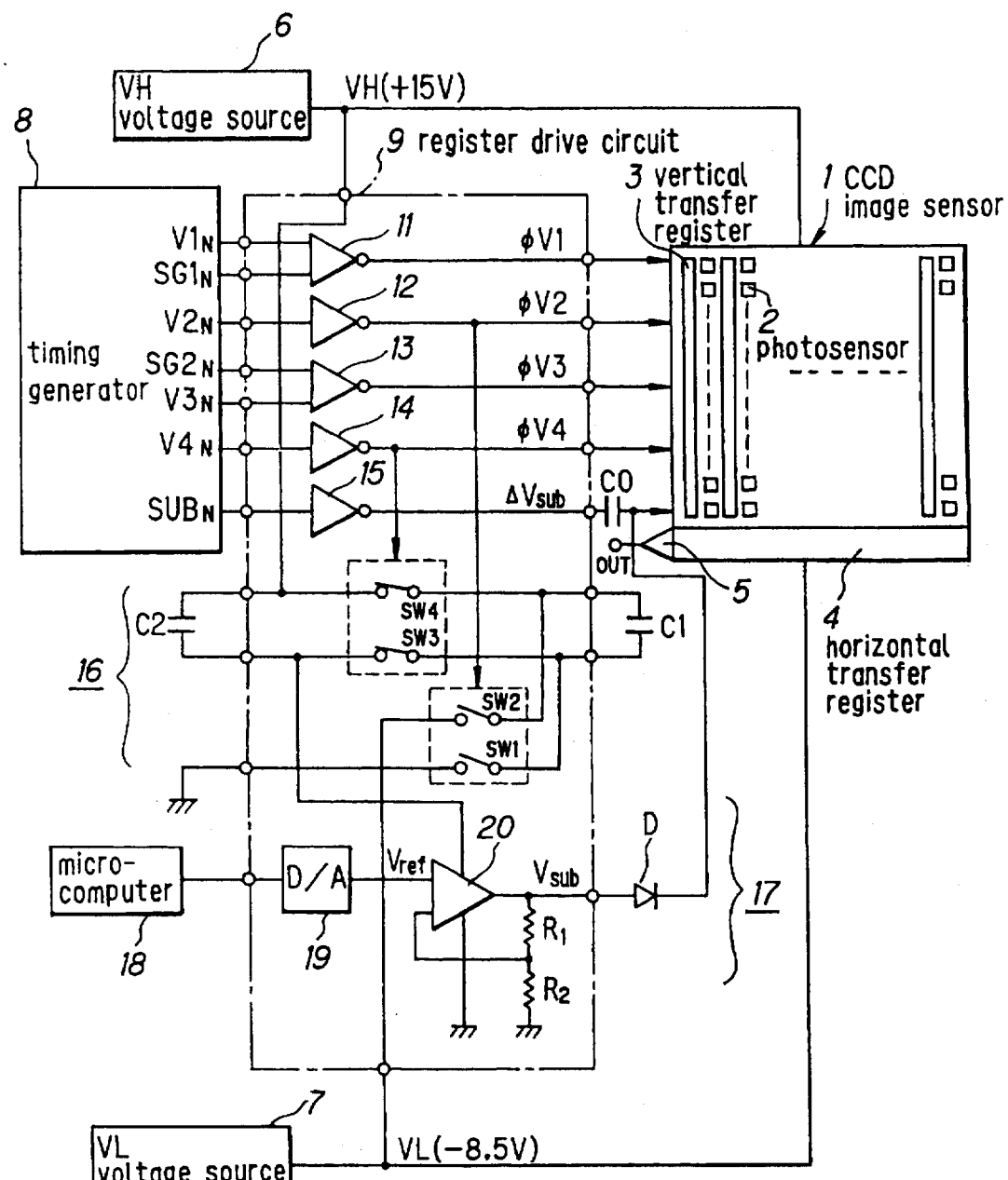
FIG. 2 is a schematic block diagram for showing a circuit arrangement of a drive circuit for a CCD image sensing element, according to a preferred embodiment of the present invention.

FIG. 2 is a schematic block diagram for showing a drive circuit for a solid-state imaging device according to one preferred embodiment of the present invention.

In FIG. 2, a CCD (charge-coupled device) image sensor 1 corresponding to a solid-state imaging device is arranged by a plurality of photosensors which are arranged in a two-dimensional form in unit of pixel, and vertical transfer registers 3 are provided at each vertical column of these photosensors 2, for transferring signal (electron) charges read out from the photosensors 2 along the vertical direction. The CCD image sensor 1 further includes a horizontal transfer register 4 for transferring the signal charges which have been transferred by the vertical transfer direction, and an output unit 5 for converting the signal charges which have been transferred by the horizontal transfer register 4 into signal voltages.

Figure 3:
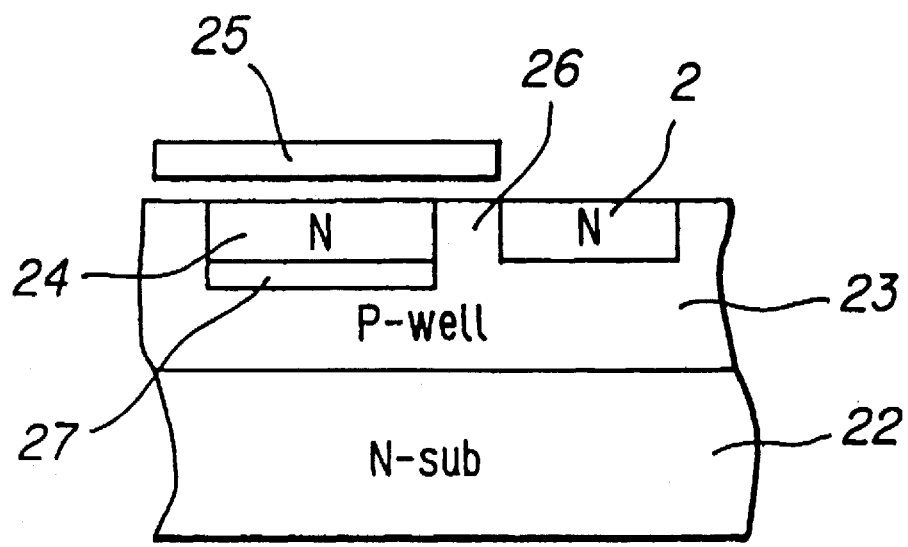
FIG. 3 is a cross-sectional view of the CCD image sensing element shown in FIG. 2.

FIG. 3 is a cross-sectional view of a single pixel of the above-described CCD image sensor 1. In this pixel of the CCD image sensor 1, a p type well 23 is fabricated on an n-type semiconductor substrate 22, and both of the photosensor 2 and a CCD channel 24 are formed on this p type well 23 through a read gate 26 and located adjacent to each other. A gate electrode 25 is manufactured above the CCD channel 24 in such a manner that the gate electrode 25 is electrically insulated from the CCD channel 24. Also, a p-type punch-through preventing layer 27 is fabricated under the CCD channel 24.

Referring back to the circuit arrangement of the drive circuit shown in FIG. 2, as a power source voltage of this CCD image sensor 1, there are utilized a VH voltage (e.g., 15 V) applied from a VH voltage source 6 and an LV voltage (e.g., −8.5 V) applied from an LV voltage source 7.

A timing generator 8 generates, for instance, 4-phase timing pulses "V1$_N$" to "V4$_N$" (subscript "N" denotes a negative logic hereinafter) used to drive the vertical transfer registers 3 of the CCD image sensor 1, timing pulses "SG1$_N$" and "SG2$_N$" used to read the signal charges from the photosensor 2 to the vertical transfer registers 3, and various sorts of timing signals for timing pulse SUB$_N$ of an electronic shutter. These timing signals are supplied to a register drive circuit 9 which is operable under the above-described VH voltage and VL voltage as a power source voltage thereof.

In response to the 4-phase timing pulses V1$_N$ to V4$_N$, this register drive circuit 9 produces 4-phase clock pulses φV1 to ΔV4, and also produces a shutter pulse ΔVsub in response to the timing pulse SUB$_N$. The register drive circuit 9 includes drivers 11 to 14 for driving the vertical transfer registers 3 and also a driver 15 for driving the electronic shutter.

Among these 4-phase clock pulses φV1 to φV4, the first phase clock pulse φV1 and the third phase clock pulse φV3 have 3-level values containing the read pulse based upon the timing pulses SG1$_N$ and SG2$_N$, which are also commonly used to read the signal charges from the photosensor 2 to the vertical transfer registers 3.

The shutter pulse ΔVsub is superimposed with a substrate voltage Vsub (will be described later) via a DC cutting capacitor CO, and then, the resultant pulse voltage is applied to the n-type semiconductor substrate 22 of the image sensor 1.

The register drive circuit 9 furthermore includes a booster circuit for boosting the VH voltage, for instance, a charge pumping type booster circuit 16, and a substrate voltage setting circuit 17 for setting a desirable substrate voltage "Vsub" to be applied to the CCD image sensor 1, in which the boosted voltage of this booster circuit 16 is used as the power source voltage.

The charge pumping type booster circuit 16 is arranged by a primary capacitor C1, a secondary capacitor C2, a switch SW1 connected between one end of the capacitor C1 and a ground line, a switch SW2 connected between the other end of this capacitor C1 and the VL voltage source 7, and also switches SW3 and SW4 connected across both ends of the capacitors C1 and C2. One end of the capacitor C2 is connected to the VH voltage source 6, and a charge pump output is derived from the other end of the capacitor C2.

In the above-explained charge pumping booster circuit 16, for instance, the switching operations by the switches SW1 and SW2 are alternately performed in synchronism with the clock pulse $\phi V2$, and also the switching operations by the switches SW3 and SW4 are alternately executed in synchronism with the clock pulse $\phi V4$, so that a boosted voltage of 23.5 V (=15.0 V+8.5 V) can be obtained as the charge pump output.

It should be noted that the basic boosting operation and the control operation of this charge pumping type booster circuit 16 will be discussed more later in detail.

The substrate voltage setting circuit 17 is constructed of a D/A (digital-to-analog) converter 19 for D/A-converting digital data which is supplied from, for instance, an externally provided microcomputer 18, into analog data, and an operational amplifier 20 for setting a DC voltage derived from the D/A converter 19 to a desirable substrate voltage Vsub as a reference voltage Vref, in which the boosted voltage obtained from the booster circuit 16 is used as the operation voltage thereof. In this substrate, voltage setting circuit 17 is so designed as to subdivide an output voltage of the operational amplifier 20 by way of resistors R1 and R2, and to feed back this subdivided output voltage.

The substrate voltage Vsub is set to an optimum voltage value for the respective CCD image sensors 1 under control of the microcomputer 18. The substrate voltage having such an optimum value is applied via a diode D to the substrate 22 of the CCD image sensor 1. To realize the electronic shutter operation in this CCD image sensor 1, the shutter pulse $\Delta Vsub$ supplied from the driver 15 is employed as a reference potential used for a diode clamping operation.

In the register drive circuit 9 with the above-described circuit arrangement, the drivers 11 to 15, the switches S1 to S4 of the charge pumping type booster circuit 16, and the D/A converter 19, operational amplifier 20, and resistors R1, R2, which constitute the substrate voltage setting circuit 17 are fabricated on the same semiconductor chip, namely in a single semiconductor chip.

As previously described, the operation voltage of the register drive circuit 9 is boosted by employing the charge pumping type booster circuit 16, and then, the boosted voltage is used as the operation voltage of the substrate voltage setting circuit 17. As a consequence, since no longer such a power supply for exclusively setting the substrate voltage Vsub is required, an external circuit which is required when the entire CCD image sensor drive circuit is fabricated as an integrated circuit can be eliminated.

Also, the switching operation of the charge pumping type booster circuit 16 is performed in synchronism with the driving clock pulse (namely, the vertical transferring clock pulse $\phi V2$ in this preferred embodiment) for the CCD image sensor 1, so that since no beat phenomenon occurs between the output signal from the CCD image sensor 1 and this driving clock pulse, the image quality of the CCD image sensor 1 is not deteriorated.

Then, a description will now be made of the basic operation and control operation of the above-explained charge pumping type booster circuit 16.

Figure 4:
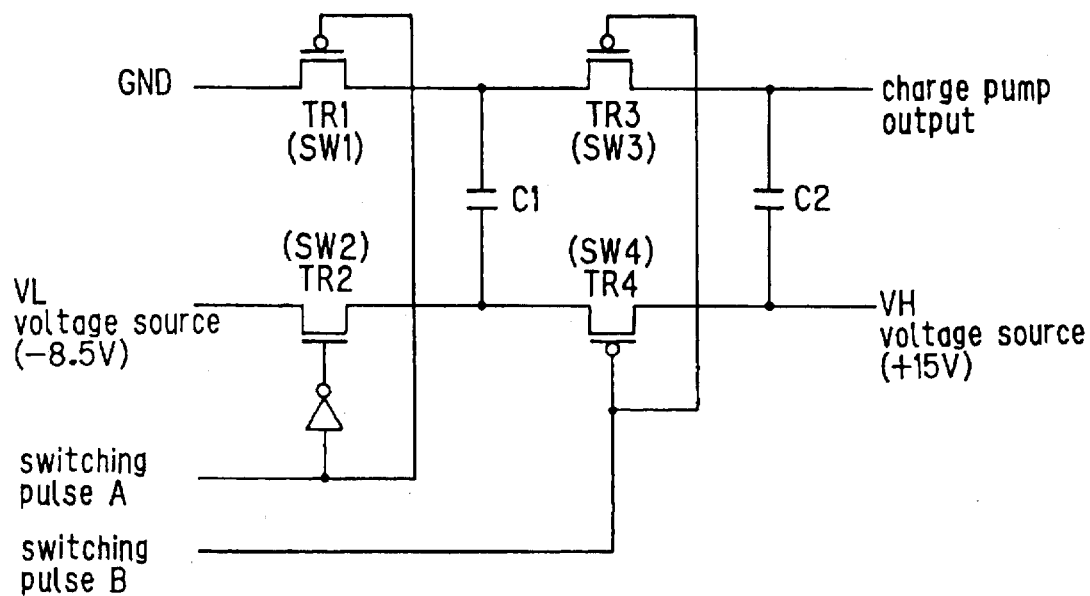
FIG. 4 represents a circuit diagram of a charge pumping type booster circuit employed in the drive circuit of FIG. 2.

FIG. 4 shows a concrete example of an internal circuit of the charge pumping type booster circuit 16. In this booster circuit, MOS transistors TR1 to TR4 corresponds to the switches SW1 to SW4 employed in the charge pumping type booster circuit 16 shown in FIG. 2.

In the booster circuit of FIG. 4, the MOS transistors TR1 and TR2 (i.e., SW1 and SW2) are alternately switched in response to the switching pulse "A", and also the MOS transistors TR3 and TR4 (i.e., SW3 and SW4) are alternately switched in response to the switching pulse "B", so that electron charges corresponding to the VL voltage (−8.5 V), which have been stored in the primary capacitor C1, are transferred to the secondary capacitor C2, one end of which is fixed to the VH voltage (+15 V). As a result of this switching operation, the boosted voltage of |VL|+|VH| can be derived as the charge pumping output.

Figure 5:
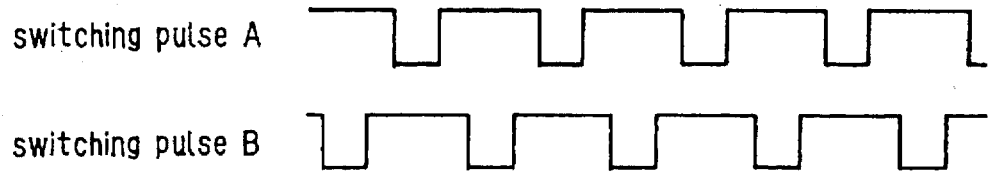
FIG. 5 is a timing chart for showing switching pulses A and B used in the drive circuit of FIG. 4.

In view of the principle operation of this charge pumping type booster circuit 16, in order not to turn ON the MOS transistors TR1, TR2 (SW1, SW2) and the MOS transistors TR3, TR4 (SW3, SW4) at the same time, as represented in a timing chart of FIG. 5, these switching pulses "A" and "B" are so designed that ON periods (negative logic) of these switching pulses are not overlapped with each other.

Figure 6:
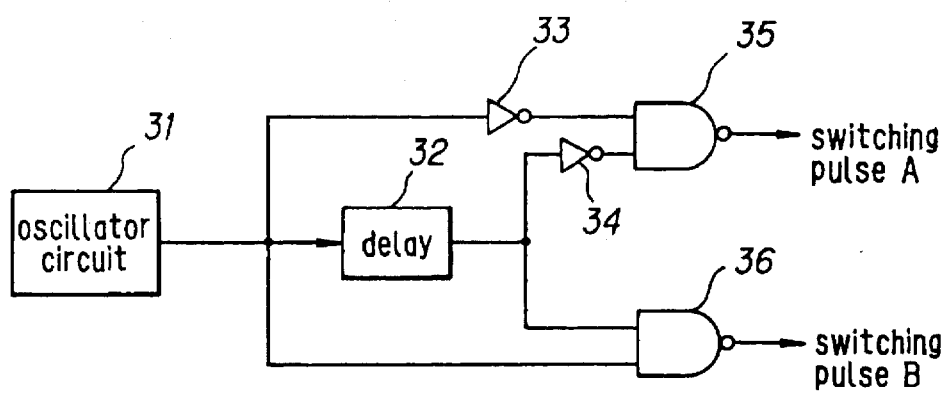
FIG. 6 is a schematic block diagram of an arrangement of a switching pulse generating circuit shown in FIG. 2.

Normally, as shown in FIG. 6, to generate such switching pulses "A" and "B", the below-mentioned switching pulse generating circuit is required. That is, this switching pulse generating circuit is arranged by an oscillator circuit 31 for producing a pulse having a preselected repetition period, a delay circuit 32 for delaying the pulse oscillated from this oscillator circuit 31 by a predetermined time, a NAND gate 35 having two inputs, one input being an inverted oscillator output of the oscillator circuit 31 obtained from an inverter 33 and the other input being an inverted delay output of the delay circuit 32 obtained from an inverter 34, and also another NAND gate 36 having two inputs, one input being the oscillator output of the oscillator circuit 31 and the other input being the delayed output of the delay circuit 32.

Figure 7:
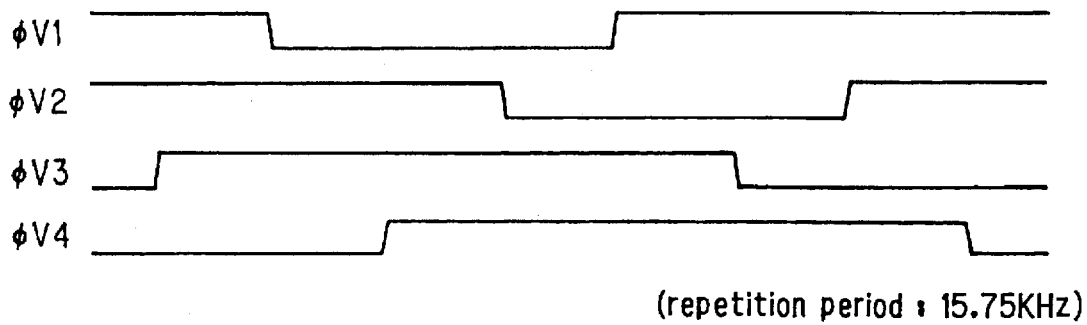
FIG. 7 is a timing chart for indicating 4-phase clock pulses used to drive the vertical transfer register employed in the drive circuit of FIG. 2.

As apparent from a timing chart of FIG. 7, the phases and the duty ratios of the 4-phase clock pulses $\phi V1$ to $\phi V2$ used to drive the vertical transfer register 3 of the CCD image sensor 1 are different from each other in this preferred embodiment. In particular, specific attention is paid to such a fact that the clock pulse $\phi V2$ and $\phi V4$ have no overlapped periods, and these specific clock pulses $\phi V2$ and $\phi V4$ are employed as the switching pulses A and B for the charge pumping type booster circuit 16.

As a result, since no longer such a switching pulse generating circuit, as shown in FIG. 6, for generating the switching pulses A and B is required, the resultant circuit arrangement can be made simpler than that of the above-described entire circuit arrangement.

It should be noted that although the charge pumping type booster circuit 16 has been employed as the booster circuit for boosting the operation voltage of the register drive circuit 9 in the above described preferred embodiment, the present invention is not limited thereto, but may be replaced with a switching regulator. In this alternative case, the drive frequency of this switching regulator may be selected to be the frequency of the driving clock pulse for the CCD image sensor 1.

Furthermore, although the clock pulse $\phi V2$ and $\phi V4$ have been directly used as the switching pulses "A" and "B" in the above-explained preferred embodiment, the present invention is not restricted thereto. Alternatively, these switching pulses "A" and "B" may be produced based upon, for example, the clock pulse $\phi V2$.

Also, the D/A converter 19 is contained in the substrate voltage setting circuit 17 so as to convert the externally applied digital data into the corresponding analog data which is then used as the reference voltage Vref of the operational amplifier 20 in the above-described preferred embodiment. Alternatively, the DC voltage produced from the variable resistor VR or the like may be directly applied as this reference voltage Vref.

As previously explained in detail, in accordance with the present invention, there are the following advantages: In the solid-state imaging device requiring the substrate voltage having the higher voltage value than the supply voltage of this imaging device, the booster circuit for boosting this supply voltage in synchronism with the timing signal for driving the transfer registers of the solid-state imaging device is assembled in the imaging-device drive circuit. The substrate voltage setting circuit sets the substrate voltage suitable to this solid-state imaging device by utilizing the boosted voltage obtained from the booster circuit as the supply voltage of this imaging device. As a consequence, no specific voltage source exclusively used to set the substrate voltage is required, and thus, the external circuit required when the entire circuit is fabricated as the integrated circuit, can be eliminated.

Furthermore, since the switching operation in the booster circuit is performed in synchronism with the timing signal used to drive the transfer register, no beat phenomenon occurs between the output of the solid-state imaging device and the driving clock pulse, and deterioration in the image quality caused by such a beat phenomenon can be prevented.

What is claimed is:

1. A driving circuit for a solid-state imaging device having a plurality of photo sensors generating charges corresponding to an incident light thereon and accumulating the charges therein, a video signal output means outputting a video signal corresponding to the accumulated charges and a charge drain discharging the charges from the plurality of photo sensors, the driving circuit comprising:

a register drive circuit driving the video signal output means in response to a timing signal;

a booster circuit receiving a first voltage and a second voltage, said booster circuit generating a third voltage greater than the second voltage, the second voltage being greater than the first voltage, said booster circuit being driven in synchronism with the timing signal; and a voltage setting means for setting a drive voltage of the charge drain based on the third voltage.

2. The driving circuit of claim 1 wherein the booster circuit and the voltage setting means are formed on or in the same semiconductor substrate.

3. The driving circuit of claim 1 wherein the booster circuit includes a charge pumping circuit which is switched by a switching signal produced from the timing signal.

4. The driving circuit of claim 1 wherein the voltage setting means includes a D/A converter for converting digital data to analog data and outputting the analog data, the digital data being supplied from an external unit of the voltage setting means.

5. The driving circuit of claim 1 wherein the voltage setting means sets the drive voltage of the charge drain in accordance with the analog data.

6. The driving circuit of claim 1 wherein the voltage setting means sets the drive voltage of the charge drain in accordance with a DC voltage supply from outside of the voltage setting means.

7. The driving circuit of claim 1 wherein the plurality of photo sensors are constructed of semiconductor regions of a first conductivity type.

8. The driving circuit of claim 7 wherein the charge drain is constructed at a semiconductor region of a first conductivity type and located beneath the photo sensors through a semiconductor region of a second conductivity type.

9. The driving circuit of claim 8 wherein the charge drain is formed on a surface opposite to a major surface of a semiconductor body on which the solid-state imaging device is formed.

* * * * *